United States Patent [19]

Rezek et al.

[11] Patent Number: 4,578,126
[45] Date of Patent: Mar. 25, 1986

[54] LIQUID PHASE EPITAXIAL GROWTH PROCESS

[75] Inventors: Edward A. Rezek, Redondo Beach; Lawrence M. Zinkiewicz, West Hollywood, both of Calif.

[73] Assignee: TRW Inc., Redondo Beach, Calif.

[21] Appl. No.: 506,683

[22] Filed: Jun. 22, 1983

[51] Int. Cl.$^4$ .......................................... H01C 21/208
[52] U.S. Cl. ................................. 148/171; 29/576 E; 29/569 L; 148/172; 156/624
[58] Field of Search ............... 148/171, 172; 156/624; 29/576 E, 569 L; 252/62.3 GA

[56] References Cited

U.S. PATENT DOCUMENTS

| | | | |
|---|---|---|---|
| 2,778,802 | 1/1957 | Willardson et al. | 148/1.5 X |
| 3,421,952 | 1/1969 | Conrad et al. | 148/175 |
| 3,448,350 | 6/1969 | Yamashita et al. | 317/234 |
| 3,664,294 | 5/1972 | Solomon | 148/171 |
| 3,971,870 | 7/1976 | Christensen et al. | 428/336 |
| 3,994,755 | 11/1976 | Kamath et al. | 148/172 |
| 4,004,953 | 1/1977 | Otsubo et al. | 148/172 |
| 4,026,735 | 5/1977 | Kamath et al. | 148/171 |
| 4,028,147 | 6/1977 | Kamath et al. | 148/171 |
| 4,032,950 | 6/1977 | Kamath et al. | 357/17 |
| 4,063,210 | 12/1977 | Coliver | 338/7 |
| 4,158,207 | 6/1979 | Bishop et al. | 357/18 |
| 4,160,261 | 7/1979 | Casey, Jr. et al. | 357/23 |
| 4,188,244 | 2/1980 | Itoh et al. | 148/174 |
| 4,190,486 | 2/1980 | Kyle | 156/601 |
| 4,193,835 | 3/1980 | Inoue et al. | 156/606 |
| 4,204,893 | 5/1980 | Cox | 148/175 |
| 4,227,962 | 10/1980 | Antypas | 156/624 |
| 4,231,050 | 10/1980 | Casey, Jr. et al. | 357/16 |
| 4,233,090 | 11/1980 | Hawrylo | 148/171 |
| 4,238,252 | 12/1980 | Kamath et al. | 148/171 |
| 4,263,064 | 4/1981 | Clawson et al. | 148/172 X |
| 4,296,387 | 10/1981 | Sugino et al. | 331/94.5 H |
| 4,297,783 | 11/1981 | Casey, Jr. et al. | 29/578 |
| 4,301,362 | 11/1981 | Mourou | 250/211 J |
| 4,309,670 | 1/1982 | Burnham et al. | 331/94.5 H |
| 4,347,437 | 8/1982 | Mourou | 250/211 R |
| 4,361,887 | 11/1982 | Nakamura et al. | 372/50 |
| 4,365,336 | 12/1982 | Sugino et al. | 372/45 |
| 4,371,406 | 2/1983 | Li | 148/171 |
| 4,372,791 | 2/1983 | Hsieh | 148/172 X |
| 4,376,138 | 3/1983 | Alferness et al. | 427/160 |
| 4,468,258 | 8/1984 | Pfister et al. | 148/171 X |
| 4,498,937 | 2/1985 | Isozumi et al. | 148/171 |

OTHER PUBLICATIONS

Dazai et al., "The Preparation and the Properties of Semi-Insulating GaAs Epitaxial Layer by Iron Doping", Fujitsu Technical Journal, vol. 12, No. 2, Jun. 15, 1976, Jpn., pp. 179–189.

Pamplin, Ed. Crystal Growth, U. of Bath, England, 1980.

Primary Examiner—George T. Ozaki
Attorney, Agent, or Firm—Noel F. Heal; Robert M. Wallace

[57] ABSTRACT

A liquid phase epitaxial growth process for particular use in growing semi-insulating epitaxial layers of III-V semiconductor compounds such as indium phosphide, indium gallium arsenide, and indium gallium arsenide phosphide. The high resistivity of the layer is achieved by doping it with a deep level dopant such as cobalt, in a concentration in the range of 0.6 to 1.0 atomic percent, and by purifying the growth solution to an impurity concentration of at most $1 \times 10^{16}$ atoms per cubic centimeter.

18 Claims, 2 Drawing Figures

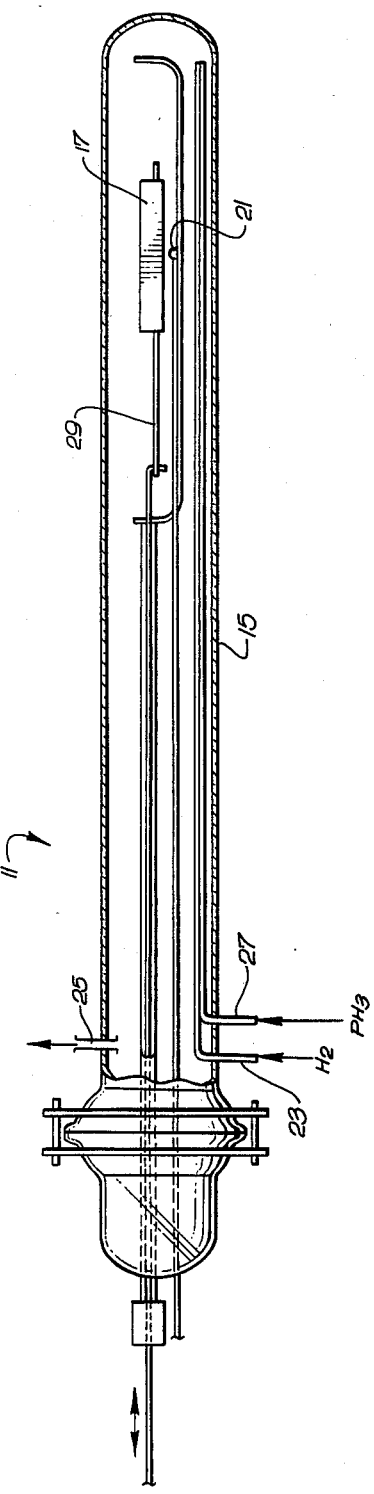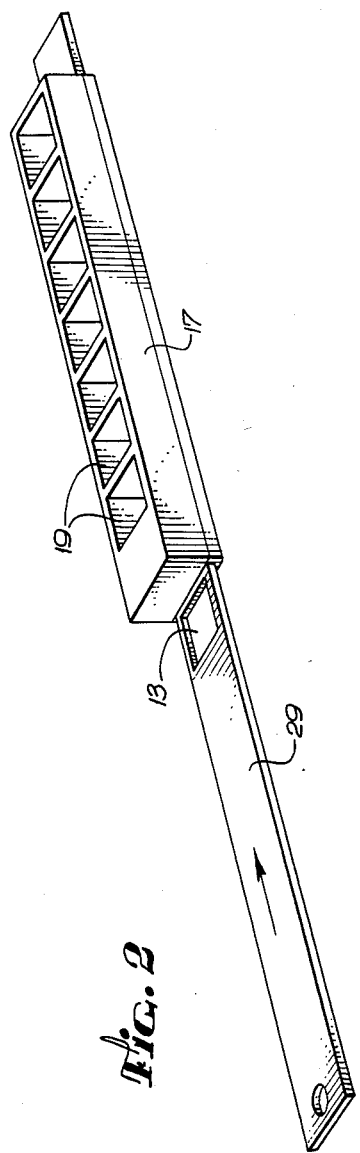

LIQUID PHASE EPITAXIAL GROWTH PROCESS

BACKGROUND OF THE INVENTION

This invention relates generally to liquid phase epitaxial processes for III-V semiconductor compounds, and, more particularly, to processes of this kind that produce high-resistance layers of such III-V compounds as indium phosphide, indium gallium arsenide and indium gallium arsenide phosphide.

Liquid phase epitaxy is a popular technique for growing individual high-quality crystalline layers in numerous different multiple-layer semiconductor devices. If is frequently desirable that such layers be semi-insulating, i.e., have resistivities that exceed about $1 \times 10^{33}$ or $1 \times 10^4$ ohm-centimeters. This facilitates monolithic integration of different kinds of devices on a common substrate.

High-resistivity epitaxial layers are particularly useful for III-V compounds such as indium phosphide, indium gallium arsenide and indium gallium arsenide phosphide, which are especially adapted for use as optoelectronic emitters and detectors useful in optical fiber communications. An example of the use of such a high-resistivity layer in a laser/FET device using indium phosphide is disclosed in a copending and commonly-assigned application for U.S. patent, Ser. No. 506,684, filed June 21, 1983 in the names of H. D. Law et al. and entitled "Integrated Laser and Field Effect Transistor."

In one known prior art process for growing a semi-insulating III-V layer using liquid phase epitaxy, chromium is used as a deep level dopant for a gallium arsenide compound. The chromium dopant serves to trap free electrons introduced by background impurities and thereby increase the material's resistivity. Although indium phosphide, indium gallium arsenide and indium gallium arsenide phosphide are likewise III-V compounds, a chromium dopant will have a substantially different effect in them. This is because chromium does not lie in as deep a position in the band gap of these three compounds as it does in gallium arsenide, whereby it does not operate to trap as many free electrons. The limited resistivity that can be achieved for these chromium-doped compounds is believed to be low enough as to make them of limited commercial value.

Bulk-grown crystals of iron-doped and cobalt-doped indium phosphide having high resistivity have been produced in the past. In these crystals, the iron and cobalt serve as deep level traps for free electrons introduced by background impurities. Since the crystals are formed only in a bulk process, however, it has not been possible to utilize them as intermediate layers of a complex multiple-layer device.

It should therefore be appreciated that there is still a need for an epitaxial growth process for particular use in growing high-resistivity layers of III-V semiconductor compounds such as indium phosphide, indium gallium arsenide and indium gallium arsenide phosphide. In particular, there is a need for such a process that can be performed using conventional apparatus. The present invention fulfills this need.

SUMMARY OF THE INVENTION

The present invention resides in a liquid phase epitaxial process for growing high-resistivity layers of III-V semiconductor compounds such as indium phosphide, indium gallium arsenide and indium gallium arsenide phosphide. The layers are grown using a purified solution of the semiconductor compound in a suitable solvent such as indium, with a predetermined concentration of a prescribed deep level dopant. In accordance with the invention, the dopant is first dissolved in the solvent and purified by baking it in a prescribed fashion, after which the semiconductor compound is added to the solution and the baking continued. The baking purifies both the intermediate solution and the final solution to an impurity concentration of less than about $1 \times 10^{16}$ atoms per cubic centimeter. The epitaxial layer is then grown on a suitable semiconductor substrate by cooling the purified final solution to a temperature below its saturation or liquidus temperature, in the presence of the substrate. The resulting epitaxial layer has a resistivity substantially higher than that of an undoped epitaxial layer of the same semiconductor material.

The invention is particularly suited for use with a deep level dopant such as cobalt. With a cobalt concentration in the purified solution on the order of 0.6 to 1.0 atomic percent, the cobalt traps enough free electrons introduced by background impurity atoms to provide a resistivity exceeding about $1 \times 10^4$ ohm-centimeters.

In more detailed aspects of the invention, the initial indium-cobalt solution is purified by baking it in a high purity graphite boat located within a quartz tube, in a purified hydrogen atmosphere. The tube is placed in a furnace, whose temperature is maintained above 700° C., for at least 48 hours. The temperature is preferably stepped down in stages, from an initial maximum temperature of about 800° C. to a final temperature of about 700° C. After the semiconductor material is added to the solution, the temperature is maintained at a level between 675° and 725° C., for a period of about 24 hours.

In the case of indium phosphide and indium gallium arsenide phosphide compounds, a substantial proportion of the phosphorus atoms in the semiconductor material added prior to the final stage of purification are lost to evaporation and reaction with a hydrogen gas and cobalt dopant. It is therefore necessary to take this loss into consideration in determining the appropriate amount of the semiconductor material to add. This is preferably accomplished by baking the solution in the presence of a purified source of additional phosphorus atoms, such as a bulk crystal of high resistivity, iron-doped indium phosphide. This maintained the solution saturated by continuously replenishing any phosphorus atoms that are lost. Alternatively, the loss of phosphorus atoms can be controlled by baking the solution with phosphine gas added to the hydrogen gas.

In another aspect of the invention, the liquidus temperature of the final purified solution is carefully adjusted by baking the solution for a predescribed time duration after the purified indium phosphide source has been removed. The resulting loss of phosphorus atoms thereby reduces the liquidus temperature to a prescribed value. Growth of the epitaxial layer preferably occurs at a temperature in the range of 2° to 10° C. below the final liquidus temperature.

Other aspects and advantages of the present invention should become apparent from the following description of the preferred embodiment, taken in conjunction with the accompanying drawings, which illustrates, by way of example, the principles of the invention.

BRIEF DESCRIPTION OF THE DRAWINGS

FIG. 1 is an elevational view of a quartz reaction tube, with a portion of it cut away to reveal a graphite boat and associated apparatus, for use in performing the liquid phase epitaxial growth process of the invention; and FIG. 2 is a perspective view of the graphite boat of FIG. 1.

DESCRIPTION OF THE PREFERRED EMBODIMENT

Referring now to the drawings, there is shown a conventional apparatus 11 for use in growing a liquid phase epitaxial layer on a substrate 13. The apparatus includes a quartz reaction tube 15 that houses a high-purity graphite boat 17 having a number of receptacles 19, at least one of which supports a solution used to grow the epitaxial layer. The tube is located within a furnace (not shown) that is heated to a selected temperature by a resistance heater. A thermocouple 21 measures the temperature within the tube. High-purity hydrogen gas, substantially at atmospheric pressure, passes through the tube by means of an inlet conduit 23 and outlet conduit 25, to facilitate purification of the solution.

In the process of the invention, the apparatus 11 is used to grow a semi-insulating or high-resistivity (greater than about $1 \times 10^4$ ohm-centimeters) epitaxial layer on an indium phosphide substrate 13 using a III-V semiconductor compound selected from the group consisting of indium phosphide, indium gallium arsenide and indium gallium arsenide phosphide. Such a semi-insulating layer can be utilized in numerous multiple-layer semiconductor devices, including, for example, optoelectronic devices for particular use in fiber optic communication.

In one preferred embodiment of the invention, the epitaxial layer is formed from a purified solution of indium phosphide and a cobalt dopant, in an indium metal solvent. When the dopant is incorporated into the resulting epitaxial crystal, it traps free electrons introduced into the crystal by background impurities. Since the layer's electrical conductivity is due to these free electrons, that conductivity can be reduced, and thus resistivity increased, by trapping a sufficiently large number of them.

An important aspect of the invention is the process for purifying the indium/cobalt/indium phosphide solution used to form the epitaxial layer. For high resistivity to be achieved, the doped semiconductor solution must have an impurity concentration of less than about $1 \times 10^{16}$ impurity atoms per cubic centimeter. Only then is the number of cobalt atoms that can be doped in the crystal sufficient to trap enough of the unwanted free electrons introduced by the impurities to have a significant effect on resistivity.

In the initial step of the process, the indium solvent and the cobalt dopant are purified by a high-temperature, long-term bakeout. First, the indium and cobalt are carefully cleaned in acid solutions, and accurately weighed. They preferably have an initial impurity concentration of less than about one part per million. The components are then placed in the graphite boat 17 which is placed in the quartz tube 15 and transferred to the furnace after palladium-purified hydrogen cover gas is introduced into the tube. The hydrogen gas preferably has an oxygen and water content of less than about one part per million.

After the indium and cobalt components are in place, the furnace temperature is raised to a high value, to dissove the cobalt in the indium and to purify the resulting melt. Solubility increases with increasing temperature. In the preferred method, the temperature is stepped from an initial maximum value of 800° C. to a final value of 700° C. In particular, the temperature is maintained at 800° C. for approximately four hours, then 780° C. for approximately eight hours, then 740° C. for approximately 24 hours, and finally 700° C. for approximately 36 hours.

After this initial purification cycle, the quartz tube is removed from the furnace and the purified solution is gradually cooled to room temperature. The high initial temperature provides a rapid bakeout of a substantial proportion of the impurity atoms. This high temperature should not be maintained for a long time, however, because it can cause silicon atoms to enter the solution from the quartz tube 15. Alternatively, the temperature can be maintained continuously at 725° C. for at least about 48 hours, or the temperature can be ramped uniformly from an initial temperature of 800° C. to a final temperature of 700° C., over a time period of about 72 hours.

In a second part of the purification process, the indium phosphide solute is purified. This is accomplished by a high-temperature, long-term bakeout after the indium phosphide has been dissolved in the purified indium/cobalt solution. Several procedures can be followed to effect this purification.

In the preferred method for purifying the indium/cobalt/indium phosphide melt, the indium phosphide solute is carefully weighed and added along with a purified indium phosphide source wafer. One suitable source wafer is a bulk crystal doped with iron to achieve high-resistivity. The melt is maintained at a temperature of about 725° C. for 24 hours, in a hydrogen atmosphere, to complete the purification process. During this time, a substantial amount of the dissolved phosphorus is lost to evaporation and reaction with both the hydrogen gas and the cobalt dopant. These phosphorus atoms are replenished, however, by the phosphorus atoms dissolved from the source wafer. Because of the source wafer, the melt is continuously fully saturated with phosphorus atoms. Delaying purification of the indium phosphide solute until after the indium solvent and cobalt dopant have been purified prevents the loss of even greater amounts of phosphorus at the higher temperatures used in that initial purification step.

An alternative technique for purifying the indium/cobalt/indium phosphide melt is to eliminate the source wafer and instead add phosphine gas ($PH_3$) to the hydrogen gas using an inlet conduit 27. Again, the melt is preferably maintained at a temperature of about 725° C., for 24 hours. One drawback to this technique is that phosphine gas can be somewhat hazardous.

Still another technique for purifying the indium/cobalt/indium phosphide melt is to introduce into the melt a large amount of excess indium phosphide. After the 24 hour bakeout at 725° C., just the desired amount of indium phosphide will remain. This technique is not preferred, however, because the indium phosphide solute that dissolves near the end of the bakeout cycle might not be adequately purified. The bakeout temperature can alternatively follow a ramp profile, from an initial temperature of about 750° C. to a final temperature of about 700° C.

It is ordinarily desirable to grow epitaxial layers at as low a temperature as possible, so as to minimize the diffusion of dopants in previously-formed layers of the device on which the epitaxial layer is being grown. Accordingly, it is preferred to grow the cobalt-doped indium phosphide epitaxial layer at a temperature on the order of 630° to 660° C. The melt's saturation or liquidus temperature is preferably on the order of 2° to 10° C. above this growth temperature.

To achieve the desired liquidus temperature, the purified melt is subjected to a bakeout at approximately 700° C., to eliminate enough phosphorus atoms to leave behind the appropriate number that just saturates the melt at the desired temperature. A decreasing temperature ramp can alternatively be used.

After the purified melt has been adjusted to have the desired liquidus temperature, the epitaxial layer can be grown on the substrate 13. To accomplish this, the indium phosphide substrate is loaded into a slide 29 associated with the boat 17, which is again placed in the quartz tube 15. Purified hydrogen gas is directed through the tube via the inlet conduit 23 and outlet conduit 25. When the oxygen content in the gas is sufficiently low, e.g., about one part per million, the tube is placed in the furnace and the temperature raised to a value greater than the melt's liquidus temperature. After a short period of time, e.g., 30 minutes, to allow the melt to thoroughly mix, the temperature is lowered to a value at or below the melt's liquidus temperature, where epitaxial growth can begin.

The first step in this epitaxial growth is the removal of any thermal damage present on the dinium phosphide substrate 13. This is accomplished by first positioning the slide 29 such that the substrate is located under a pure indium melt, to etch a few microns of the substrate surface. The substrate is then slide under the purified indium/cobalt/indium phosphide melt, to begin growing the epitaxial layer on it. Any of a number of conventional epitaxial growth techniques can be used, including super cooling, step cooling, equilibrium cooling and cooling with two-phase solution epitaxy. Super cooling is preferred for growing an apitaxial layer on an indium phosphide substrate.

After a suitable period of time, depending on the epitaxial layer thickness desired, the substrate 13 is removed from the indium/cobalt/indium phosphide melt, and the quartz reaction tube 15 is removed from the furnace. The boat 17 and its contents then cool gradually to room temperature, completing the epitaxial growth of the semi-insulating cobalt-doped indium phosphide layer.

The amount of cobalt dopant that must be added to the melt to trap free electrons and thereby provide high resistivity varies in accordance with the melt's impurity concentration. When the preferred purification procedure outlined above is followed, resulting in an impurity concentration on the order of $1 \times 10^{15}$ atoms per cubic centimeter, highest resistivity is achieved by doping the melt with approximately 0.6 to 1.0 atomic percent.

As set forth in the following table, only a portion of the added cobalt actually mixes into the solution as elemental cobalt. The remainder either does not dissolve in the melt or reacts with phosphorus atoms to form cobalt-phosphorus compounds. This loss of cobalt is not considered to be important, however, since the initial amount can simply be adjusted upwardly so that the desired dopant concentration can be achieved. Similarly, the loss of phosphorus atoms to the cobalt-phosphorus compounds can be accounted for by simply adding additional indium phosphide, thereby maintaining the desired liquidus temperature for the melt.

TABLE

| Amount of Co-dopant Added to Melt | Amount of Elemental Cobalt Remaining in Melt (est.) | Resistivity |
| --- | --- | --- |
| 1.0 atomic % | 0.57 atomic % | $>10^5$ ohm-cm |
| 0.8 | 0.44 | $>10^5$ |
| 0.6 | 0.32 | $>10^5$ |
| 0.5 | 0.28 | 0.93 |
| 0.4 | 0.23 | 0.68 |
| 0.2 | 0.13 | 1.5 |
| 0.1 | 0.09 | 0.51 |
| 0 | 0 | 1.6 |

As previously mentioned, the invention also has utility when used with other III-V semiconductor compounds, such as indium gallium arsenide and indium gallium arsenide phosphide. In each case, the purification procedures described above must be modified slightly.

In the case of indium gallium arsenide, the cobalt dopant and indium solvent are purified as described above. Thereafter, instead of adding indium phosphide, both indium arsenide and gallium arsenide are added to the melt. As before, the melt is then purified by a high temperature bakeout. For example, the melt can be maintained at a temperature of 700° C. for about 40 hours, or it can follow a decreasing temperature ramp, beginning at 700° C. and ending at 650° C. after a period greater than 40 hours. Sufficient indium arsenide and gallium arsenide must be added to the melt to compensate for the loss of arsenic and gallium atoms due to reactions with the cobalt dopant atoms. The residual amounts of gallium and arsenic atoms must correspond to the relative percentages of these atoms required to grow an indium gallium arsenide epitaxial layer lattice matched to the indium phosphide substrate. The condition for lattice matching can be described as a difference in lattice parameter between the epitaxial layer and the substrate of less than about $1.8 \times 10^{-2}$ A°.

The amount of cobalt arsenide that forms depends on the bakeout temperature and time. Less cobalt arsenide is formed at lower temperatures, e.g., 660° C., but the bakeout time must then be substantially increased, e.g., to 100 hours.

After the indium gallium arsenide melt has been purified, as described above, the high-resistivity epitaxial layer can be grown on the substrate 13 using a conventional step cooling procedure. In this procedure, the melt is first raised above its liquidus temperature for a period of about 30 to 45 minutes, to thoroughly mix the melt, after which the temperature is reduced to a level about 2° to 4° C. below the liquidus temperature for a period of one to 45 minutes, depending on the layer thickness desired.

In the case of indium gallium arsenide phosphide semiconductor materials, the indium solvent and cobalt dopant are first purified in the same manner as described above with respect to indium phosphide, after which an indium phosphide solute is added and the melt is purified as described above in relationship to the indium phosphide example.

After the indium/cobalt/indium phosphide melt has been purified, gallium arsenide and indium arsenide are added to the melt. This is then purified in a high temperature bakeout, in the same manner as described above with respect to the indium gallium arsenide example. This bakeout also serves to adjust the amount of phosphorus so as to provide the desired liquidus temperature. The bakeout is preferably accomplished by insuring that there is initially an excess of phosphorus atoms in the melt, and then maintaining it at a temperature in the range of about 650° to 680° C. for whatever time is required to reach the desired liquidus temperature. Alternatively, the final bakeout can be accomplished by first insuring that the melt contains the exact amount of phosphorus required, and by then baking out the melt at the desired liquidus temperature in contact with a high-resistivity bulk-grown indium phosphide source wafer. This bakeout is essentially the same as that described above with respect to the indium gallium arsenide example.

As was the case with the indium gallium arsenide solution, sufficient indium arsenide and gallium arsenide must be added to compensate for losses of arsenic and gallium atoms and thereby ensure that the resulting epitaxial layer will be lattice matched to the indium phosphide substrate 13.

An alternative technique for purifying the indium gallium arsenide phosphide material is to add the indium phosphide at the final stage of purification. In this way, the amount of phosphorus lost to evaporation is minimized.

Finally, the melt is used to grow a high-resistivity epitaxial layer on an indium phosphide substrate 13 using a conventional step cooling procedure.

The processes described above can be utilized to form high-resistivity epitaxial layers in numerous semiconductor devices. For example, the cobalt-doped indium phosphide epitaxial layer can be used as a high-resistivity layer isolating a semiconductor laser from an associated MISFET in an integrated laser/FET device. An example of such a device is disclosed in the copending application mentioned above, Ser. No. 506,684. Other uses of the cobalt-doped indium phosphide epitaxial layer include a replacement for the oxide layer in an "oxide-stripe" laser, a replacement for the reverse-biased pn junction in a buried heterostructure laser, and a restricted contact area, edge-emitting LED, which reduces current spreading. The layer can also be used as a photoconductive detector and as a means of integrating such a detector with a FET. These applications are, of course, listed only by way of example. It will be appreciated by those of ordinary skill in the art that a high-resistivity epitaxial layer, formed in accordance with the process of the invention can be utilized in many other situations, as well.

High resistivity epitaxial layers formed of cobalt-doped indium gallium arsenide and indium gallium arsenide phosphide can likewise be used in numerous semiconductor devices. The indium gallium arsenide layer is particularly useful as a photoconductive detector, since it is responsive in a more useful wavelength range than its corresponding indium phosphide layer.

It should be appreciated from the foregoing description that the present invention provides an effective process for growing high-purity, semi-insulating epitaxial layers in semiconductor devices using indium phosphide, indium gallium arsenide and indium gallium arsenide phosphide compounds. The process can be practiced using conventional apparatus and materials, yet it facilitates a significant improvement in numerous multiple-layer semiconductor devices.

Although the invention has been described in detail with particularly reference to the presently-preferred embodiments, it should be understood by those or ordinary skill in the art that various modifications can be made to the specifically-disclosed processes without departing from the invention. Accordingly, the invention is limited only by the following claims.

We claim:

1. A method for producing a high-resistivity epitaxial layer on a semiconductor substrate comprising steps of:
    dissolving a prescribed amount of cobalt as a deep level dopant in an indium solvent, the step of dissolving including a step of baking the dopant and solvent in a prescribed fashion, to produce a purified intermediate solution having an impurity concentration of less than about $1 \times 10^{16}$ atoms per cubic centimeter;
    adding to the purified intermediate solution a semiconductor selected from the group consisting of indium phosphide, gallium arsenide, indium arsenide and mixtures thereof, and baking the resultant solution in a prescribed fashion, to produce a purified final solution having an impurity concentration of less than about $1 \times 10^{16}$ atoms per cubic centimeter and having prescribed relative proportions of the deep level dopant and the semiconductor material; and
    cooling the purified final solution to a temperature below its liquidus temperature, in the presence of a semiconductor substrate, to grow on the substrate an epitaxial layer of the doped semiconductor material, the resulting epitaxial layer having a resistivity substantially higher than that of an undoped epitaxial layer of the same semiconductor material.

2. A method as defined in claim 1, wherein:
    the solvent consists essentially of indium;
    the step of baking the dopant and solvent occurs at a temperature of at least 700° C., for a time period of at least 48 hours; and
    the resulting epitaxial layer has a resistivity of at least about $1 \times 10^4$ ohm-centimeters.

3. A method as defined in claim 2, wherein the step of baking the dopant and solvent steps the temperature downwardly from an initial temperature of at least 800° C. to a final temperature of about 700° C.

4. A method as defined in claim 2, wherein:
    the semiconductor material is indium phosphide; and
    the cobalt present in the final solution produced in the step of adding has a concentration in the range of 0.6 to 1.0 atomic percent.

5. A method as defined in claim 1, wherein:
    the semiconductor material is either indium phosphide or indium gallium arsenide phosphide; and
    the step of adding includes a step of replenishing any phosphorus lost by the solution due to the elevated temperature.

6. A method as defined in claim 5, wherein the step of replenishing includes a step of placing in the solution a solid source of purified indium phosphide.

7. A method as defined in claim 5, wherein the step of adding further includes a step of terminating the step of replenishing and continuing to bake the solution at a prescribed temperature, to reduce its liquidus temperature to a prescribed level.

8. A method as defined in claim 7, wherein the step of terminating and continuing reduces the liquidus temperature to a level in the range of about 630° to 670° C.

9. A method for producing a high-resistivity epitaxial layer on a semiconductor substrate comprising steps of:
dissolving in an indium solvent prescribed amounts of both cobalt and a semiconductor material selected from the group consisting of indium phosphide, gallium arsenide, indium arsenide, and mixtures thereof, the step of dissolving including a step of purifying the solution by baking it in a prescribed fashion, to reduce the concentration of impurities to a level less than about $1 \times 10^{16}$ atoms per cubic centimeter; and
cooling the purified solution to a prescribed temperature below its liquidus temperature, in the presence of a semiconductor substrate, to grow on the substrate an epitaxial layer of the cobalt-doped semiconductor material, the resulting epitaxial layer having a resistivity substantially higher than that of an undoped epitaxial layer of the same semiconductor material.

10. A method as defined in claim 9, wherein:
the solvent consists essentially of indium;
the semiconductor material consists essentially of indium phosphide;
the step of purifying includes steps of
adding the dopant to the solvent and baking the resulting solution at an elevated temperature for a prescribed time duration, and
subsequently adding the semiconductor material to the solution and baking the solution at an elevated temperature for a prescribed time duration; and
the resulting epitaxial layer has a resistivity of at least about $1 \times 10^4$ ohm-centimeters.

11. A method as defined in claim 10, wherein in the step of adding the dopant and baking the solution at an elevated temperature, the solution is baked at a temperature of at least 700° C. for a time duration of at least 48 hours.

12. A method as defined in claim 10, wherein the step of subsequently adding the semiconductor material includes a step of replenishing any phosphorus lost by the solution due to the elevated temperature.

13. A method as defined in claim 12, wherein the step of replenishing includes a step of placing in the solution a solid source of purified indium phosphide.

14. A method as defined in claim 10, wherein the step of purifying further includes a final step of baking the solution at a prescribed elevated temperature to reduce its liquidus temperature to a prescribed level.

15. A method as defined in claim 14, wherein the step of baking reduces the liquidus temperature to a level in the range of about 630° to 670° C.

16. A method as defined in claim 9, wherein in the step of cooling, the solution is maintained at a temperature 2° to 10° C. below its liquidus temperature.

17. A method as defined in claim 9, wherein the cobalt present in the purified solution produced in the step of dissolving has a relative atomic percentage in the range of about 0.6 to 1.0 percent.

18. A method for growing a high-resistivity, cobalt-doped indium phosphide epitaxial layer on a substrate, comprising steps of:
dissolving a prescribed amount of a cobalt dopant in an indium solvent, the step of dissolving including a step of baking the cobalt and indium at a temperature decreasing in steps from an initial temperature of at least 800° C. to a final temperature of about 700° C., over a time period of at least about 48 hours, to produce a purified intermediate solution having an impurity concentration of less than about $1 \times 10^{16}$ atoms per cubic centimeter;
adding a prescribed amount of indium phosphide to the purified intermediate solution, and baking the resultant solution at a temperature of about 700° C. for a time period of at least about 24 hours;
wherein the step of adding and baking includes a step of placing in the intermediate solution a solid source of purified indium phosphide, to replenish any phosphorus atoms lost by the solution due to the elevated temperature, to produce a purified indium phosphide solution having an impurity concentration of less than about $1 \times 10^{16}$ atoms per cubic centimeter;
baking the purified indium phosphide solution with the solid source of indium phosphide removed, at a temperature in the range of about 650° to 700° C., for a prescribed time duration, to reduce the liquidus temperature of the solution to a prescribed level between about 630° and 670° C. and to provide a cobalt dopant concentration in the range of 0.6 to 1.0 atomic percent; and
cooling the purified solution below its reduced liquidus temperature in the presence of a semiconductor substrate, to grow on the substrate an epitaxial layer of the cobalt-doped indium phosphide, the resulting epitaxial layer having a resistivity of at least $1 \times 10^4$ ohm-centimeters.

* * * * *